United States Patent [19]

Takahashi

[11] Patent Number: 5,627,851
[45] Date of Patent: May 6, 1997

[54] SEMICONDUCTOR LIGHT EMITTING DEVICE

[75] Inventor: Takashi Takahashi, Sendai, Japan

[73] Assignee: Ricoh Company, Ltd., Tokyo, Japan

[21] Appl. No.: 595,499

[22] Filed: Feb. 1, 1996

[30] Foreign Application Priority Data

Feb. 10, 1995 [JP] Japan ................... 7-023144

[51] Int. Cl.$^6$ ................ H01S 3/06; H01S 3/096
[52] U.S. Cl. ............... 372/44; 372/36; 372/108; 372/109
[58] Field of Search ............... 372/36, 108, 109, 372/43

[56] References Cited

U.S. PATENT DOCUMENTS

| | | | |
|---|---|---|---|
| 4,550,333 | 10/1985 | Ridder et al. | 372/36 |
| 4,581,629 | 4/1986 | Harve et al. | 372/36 |
| 4,592,059 | 5/1986 | Westermeier | 372/36 |
| 4,987,566 | 1/1991 | Shikama et al. | 372/36 |
| 5,294,815 | 3/1994 | Iechi | 372/50 |

FOREIGN PATENT DOCUMENTS

| | | |
|---|---|---|
| 2137389 | 5/1990 | Japan. |
| 330381 | 2/1991 | Japan. |
| 5136459 | 6/1993 | Japan. |

*Primary Examiner*—James W. Davie
*Attorney, Agent, or Firm*—Oblon, Spivak, McClelland, Maier & Neustadt, P.C.

[57] ABSTRACT

A semiconductor light emitting device of an edge emitting type in the present invention has an active layer surface parallel to a reference plane and has a light emitting surface formed by etching until below the active layer surface in a direction perpendicular to the reference plane. An upper surface of a substrate in front of the light emitting surface is inclined in a direction separated from the active layer surface as this upper surface advances forward from the light emitting surface. An angle formed between the reference plane and the upper surface of the substrate in front of the light emitting surface is greater than a half beam angle at half-power points of a far-field emission pattern in a vertical direction. In this construction, no light component within the full beam angle at half-power points of the far-field emission pattern as a large part of light emitted from the light emitting surface is reflected on the upper surface of the substrate in front of the light emitting surface. Accordingly, the influences of light interference can be reduced and an inclination of emitted light with respect to an optical fiber can be reduced so that a reduction in optical coupling efficiency can be restrained.

5 Claims, 14 Drawing Sheets 5,627,851

1

SEMICONDUCTOR LIGHT EMITTING DEVICE

BACKGROUND OF THE INVENTION

1. Field of the Invention

The present invention relates to a semiconductor light emitting device of an edge emitting type used in an optical interconnection, etc.

2. Description of the Related Art

In the semiconductor light emitting device of an edge emitting type, a cleavage plane is generally used widely as a light emitting surface. Since the cleavage plane is basically a smooth mirror in an atomic order, it is very effective to use the cleavage plane as a light emitting surface. However, it is difficult to form cleavage without any fragments and damages. Accordingly, the formation of cleavage causes problems in view of mass production and yield.

Therefore, the formation of a light emitting surface using etching in stead of cleavage has recently been searched. In the formation of a light emitting surface using etching, light emitting surfaces can be formed together with respect to all light emitting elements within a substrate. Therefore, the formation of a light emitting surface using etching has features of mass production and high yield which cannot be obtained in a cleavage method. Recently, smoothness of this light emitting surface is not inferior to that of the cleavage plane. In the following description, general examples of the semiconductor light emitting device having a light emitting facet formed by etching will next be described.

FIG. 1 is a view showing one example of a general etching mirror semiconductor laser (see Japanese Patent Application Laying Open (KOKAI) No. 3-30381). In FIG. 1, reference numerals 1, 2 and 3 respectively designate an n-type InP substrate, an n-type InP clad layer and an undope-InGaAsP active layer. Reference numerals 4, 5 and 6 respectively designate a p-type InGaAsP guide layer, a p-type InP clad layer and a p-type InGaAsP contact layer. Reference numerals 7, 8 and 9 respectively designate an n-type electrode, a p-type electrode and an etching facet as a reflecting mirror. In the semiconductor laser of FIG. 1, a thickness as a sum of thicknesses of the active layer and the guide layer is set to 0.3 μm so that a reduction in facet reflectivity caused by a slight inclination of the etching facet 9 is restrained to the utmost. It should be understood from FIG. 1 that the InP substrate 1 is projected forward from the etching facet 9 and a light emitting surface and an element facet form a step. This construction constitutes common structural features in the edge emitting type semiconductor light emitting device having a light emitting surface formed by etching.

FIG. 2 is a view showing one example of an optical semiconductor device in which an optical semiconductor element is adhered to a submount (see Japanese Patent Application Laying Open (KOKAI) 2-137389). In FIG. 2, reference numerals 10, 11 and 12 respectively designate the optical semiconductor element, the submount and a stem. Reference numerals 13, 14 and 15 respectively designate a metallized electrode, a light emitting point and a solder material. As pointed out in this laid-open patent, when an obstacle such as a solder material exists in front of the light emitting point 14, light emitted from the light emitting point is scattered. Similarly, there is a case in which phenomena such as light reflection, scatter, interference, etc. are caused with respect to a substrate surface in front of an etching facet described with reference to FIG. 1.

FIG. 3 is a view showing another example of the semiconductor light emitting device having a light emitting facet formed by etching (see Japanese Patent Application Laying Open (KOKAI) No. 5-136459). In FIG. 3, reference numerals 16, 17 and 18 respectively designate a substrate, a light emitting diode array of an edge emitting type and a light emitting layer (an active layer). Reference numerals 19 and 20 respectively designate a p-side electrode and an n-side electrode. In the present invention, a substrate shape in front of a light emitting surface is stepwise formed such that the following geometric relation is satisfied.

$L\ X2 < L\ Z2/\tan\theta;\ (L\ X2 \neq L\ Z2/\tan\theta),\ (0° \leq \theta \leq 90°)$ $L\ X1 < L\ Z1/\tan\theta;\ (L\ X1 \neq L\ Z1/\tan\theta),\ (0° \leq \theta \leq 90°)$ Therefore, no light emitted from the light emitting facet is interrupted on a terrace surface so that light utilization efficiency is increased.

FIG. 4 shows a semiconductor light emitting device 101 having a structure in which a substrate surface 106 is formed in front of a light emitting surface 107. In this semiconductor light emitting device 101, when light emitted from the light emitting surface 107 is reflected on the forward substrate surface 106, light reflected on the forward substrate surface 106 is interfered with the light emitted from the light emitting surface 107. Therefore, a light emitting direction is inclined several degrees upward on a substrate side. When such a semiconductor light emitting device 101 is connected to an optical fiber 103, optical coupling efficiency to the optical fiber 103 is greatly reduced since a light receiving angle of the optical fiber 103 is small even when the light emitting direction of the semiconductor light emitting device 101 is inclined several degrees. For example, a total light receiving angle of the optical fiber 103 is equal to 23° when a numeral aperture NA is equal to 0.2.

FIG. 3 shows a structure for reducing influences of this interference. In the actual semiconductor light emitting device, a far-field emission pattern also extends on a wide angle side so that it is difficult to completely remove the influences of this interference.

SUMMARY OF THE INVENTION

It is therefore an object of the present invention to provide a semiconductor light emitting device having a structure in which no reduction in optical coupling efficiency to an optical fiber caused by the inclination of a light emitting direction is caused.

In accordance with a first construction of the present invention, the above object can be achieved by a semiconductor light emitting device of an edge emitting type having an active layer surface parallel to a reference plane and having a light emitting surface formed by etching until below the active layer surface in a direction perpendicular to the reference plane;

the semiconductor light emitting device being constructed such that an upper surface of a substrate in front of the light emitting surface is inclined in a direction separated from the active layer surface as this upper surface advances forward from the light emitting surface; and an angle formed between the reference plane and the upper surface of the substrate in front of the light emitting surface is greater than a half beam angle at half-power points of a far-field emission pattern in a vertical direction.

In accordance with a second construction of the present invention, the substrate below the light emitting surface is undercut-etched in addition to the first construction.

In accordance with a third construction of the present invention, the above object can be also achieved by a semiconductor light emitting device of an edge emitting type having a light emitting surface formed by etching until below an active layer surface;

the semiconductor light emitting device being constructed such that an upper surface of a substrate in front of the light emitting surface is inclined in a direction separated from the active layer surface as this upper surface advances forward from the light emitting surface; and an angle φ formed between the upper surface of the substrate in front of the light emitting surface and a die bonding surface of the semiconductor light emitting device is provided by the following formula.

$$\phi = arc\ sin\ (\lambda/4nd)$$

In this formula, λ is a light emitting wavelength of the semiconductor light emitting device, and n is a refractive index of a medium outside the semiconductor light emitting device. Further, d is a distance of a perpendicular line drawn from an active layer position of the light emitting surface to the upper surface of the substrate in front of the light emitting surface.

In accordance with a fourth construction of the present invention, the above object can be also achieved by a semiconductor light emitting device of an edge emitting type which has a light emitting surface and an etched side face formed by etching until below an active layer surface and is formed in a mesa shape;

the semiconductor light emitting device being constructed such that an upper surface of a substrate in front of the light emitting surface is inclined in a direction separated from the active layer surface as this upper surface advances forward from the light emitting surface; and an angle φ formed between the upper surface of the substrate in front of the light emitting surface and a mesa-etched bottom surface of the substrate is provided by the following formula.

$$\phi = arc\ sin\ (\lambda/4nd)$$

In accordance with a fifth construction of the present invention, the above object can be also achieved by a semiconductor light emitting device of an edge emitting type having a light emitting surface formed by etching until below an active layer surface;

the semiconductor light emitting device being constructed such that a substrate thickness is increased as the substrate is separated from the light emitting surface; and when a back surface of the substrate is arranged on a horizontal surface, an angle φ formed between the upper surface of the substrate in front of the light emitting surface and this horizontal surface is provided by the following formula.

$$\phi = arc\ sin\ (\lambda/4nd)$$

In each of the above first to fifth constructions of the present invention, no reduction in optical coupling efficiency to an optical fiber caused by the inclination of a light emitting direction is caused.

Further objects and advantages of the present invention will be apparent from the following description of the preferred embodiments of the present invention as illustrated in the accompanying drawings.

Figure 15A:
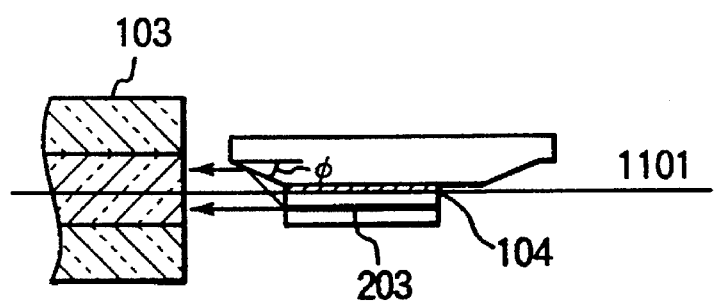
Figure 15B:
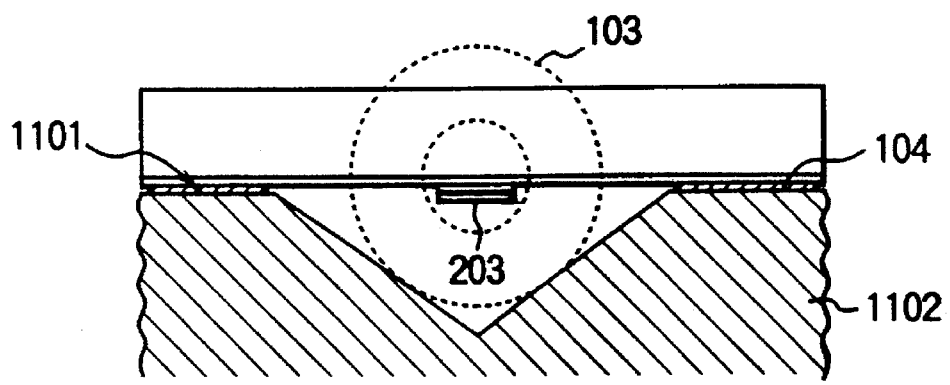
Figure 16:
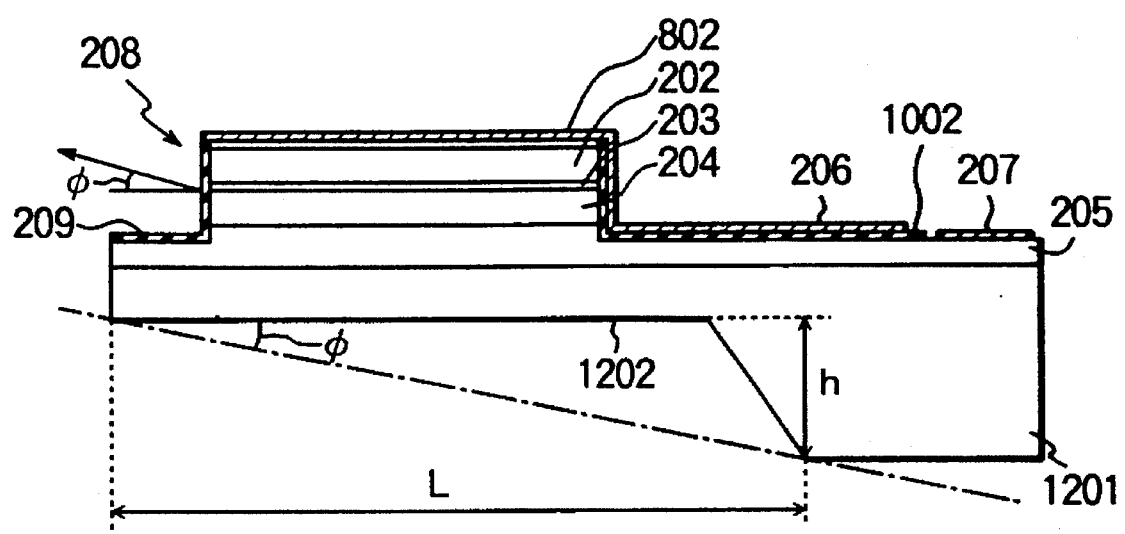
Figure 18:
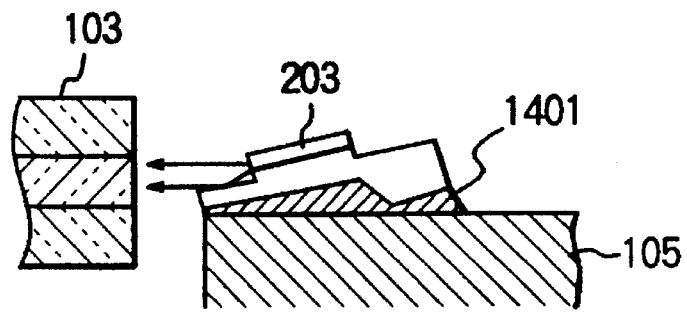
Figure 19:
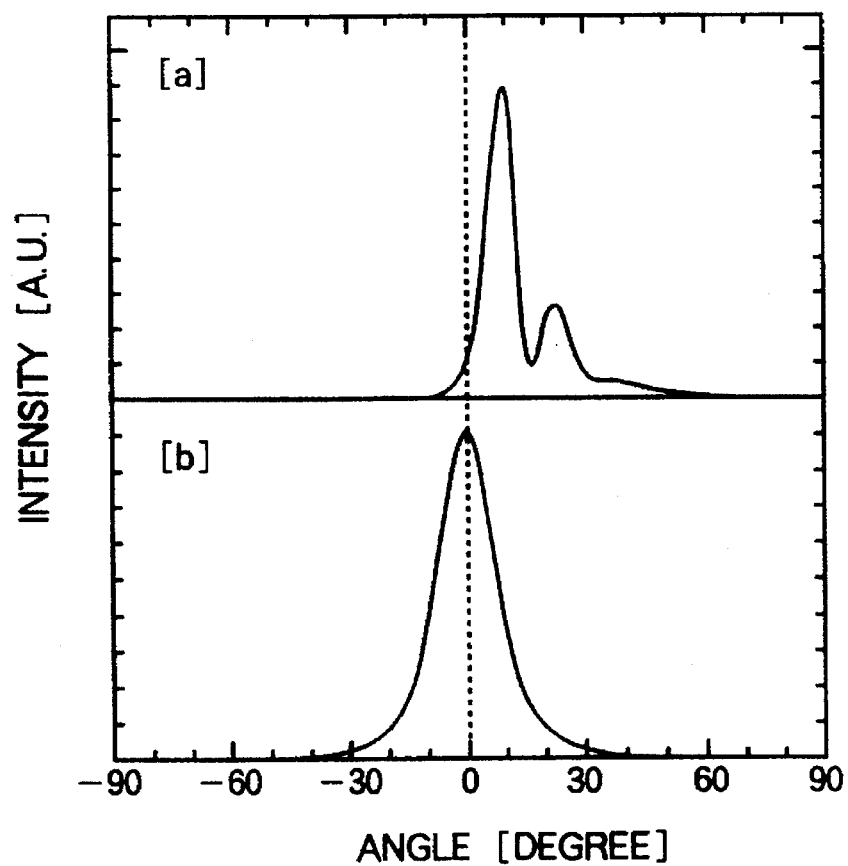
Figure 20:
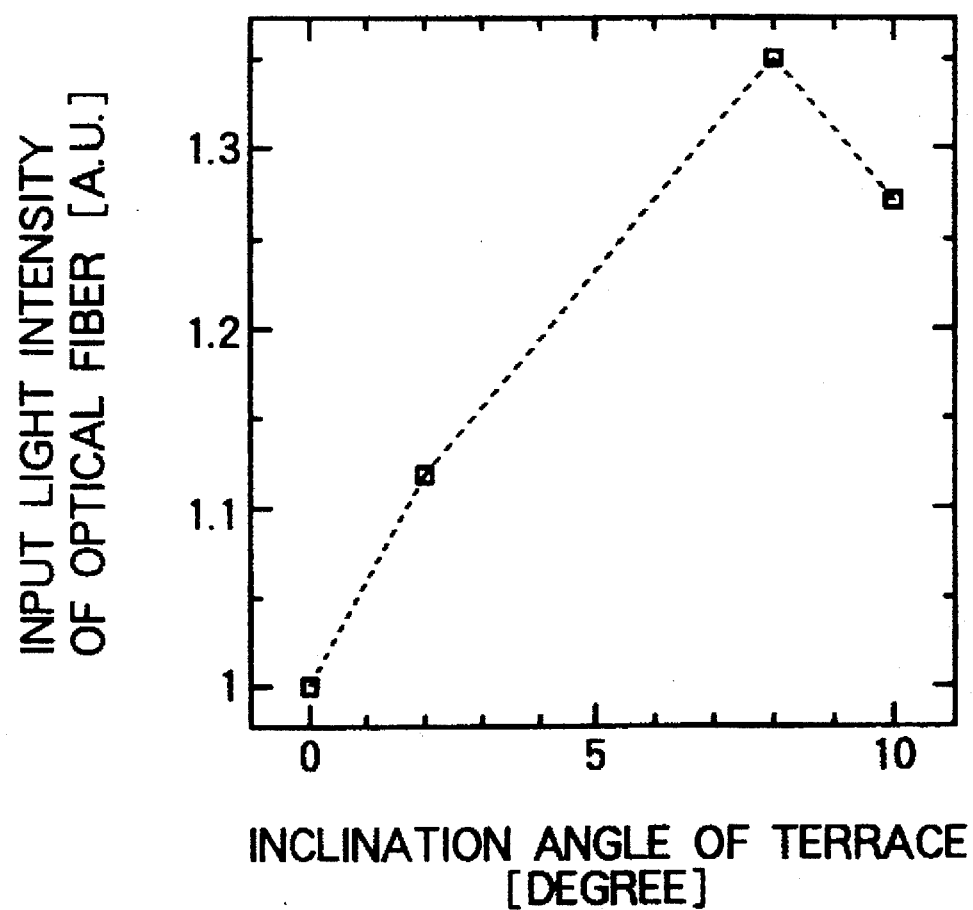

Each of FIGS. 15a and 15b is a view showing an arranging state of the semiconductor light emitting device at its mounting time in the fourth embodiment of the present invention;

FIG. 16 is a cross-sectional view of a semiconductor light emitting device in accordance with a fifth embodiment of the present invention;

FIGS. 17a to 17d are views for explaining manufacturing processes of the semiconductor light emitting device in the fifth embodiment of the present invention;

FIG. 18 is a view showing an arranging state of the semiconductor light emitting device at its mounting time in the fifth embodiment of the present invention;

FIG. 19 is a view showing one example of a light radiant angle distribution in a vertical direction of a semiconductor light emitting device; and FIG. 20 is a graph showing light intensity inputted to an optical fiber when the inclination angle of a terrace is changed.

DESCRIPTION OF THE PREFERRED EMBODIMENTS

The preferred embodiments of a semiconductor light emitting device in the present invention will next be described in detail with reference to the accompanying drawings.

Figure 1:
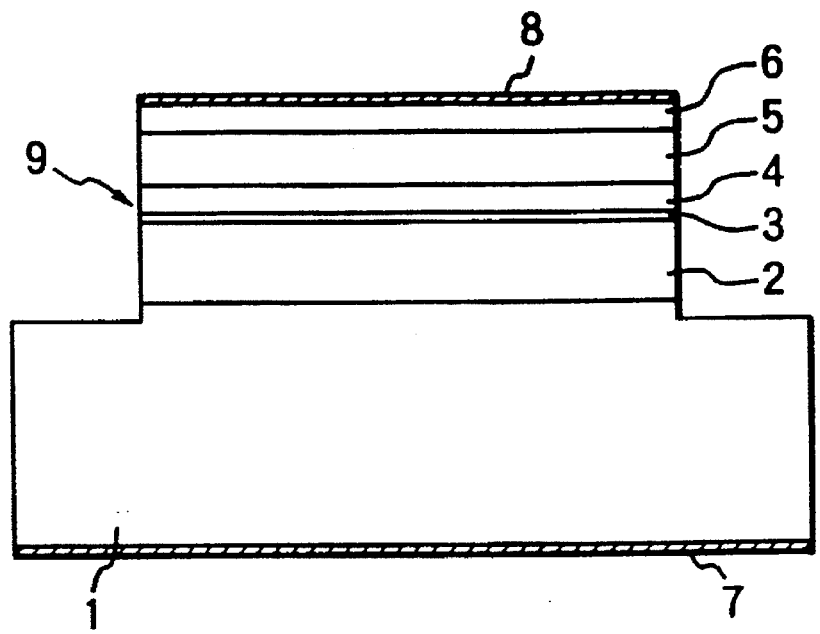
FIG. 1 is a cross-sectional view showing one example of a general etching mirror semiconductor laser.
Figure 2:
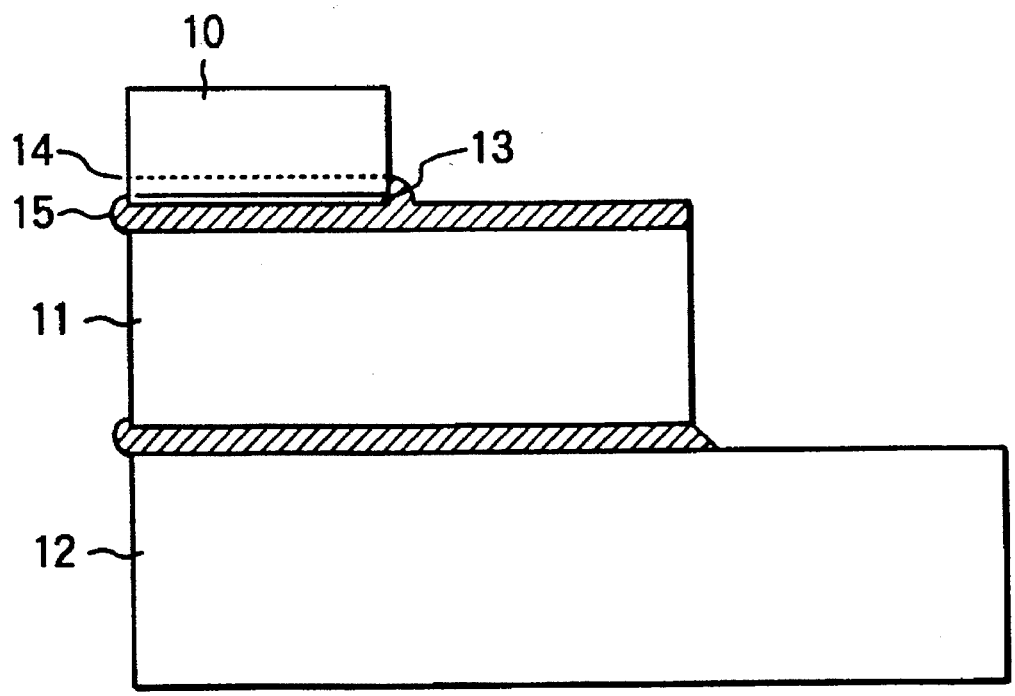
FIG. 2 is a view showing an arranging state of a general semiconductor light emitting device at its mounting time.
Figure 3:
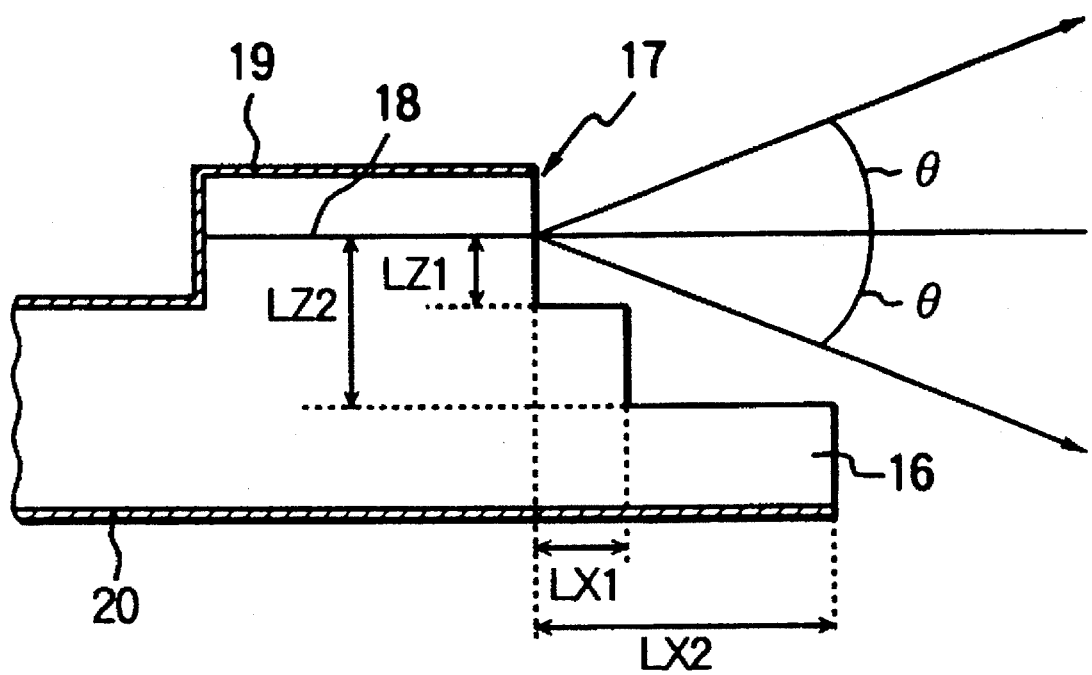
FIG. 3 is a cross-sectional view of a general etching edge emitting diode.
Figure 4:
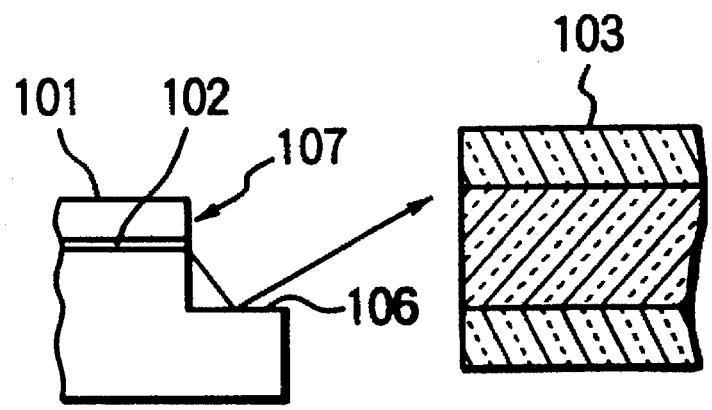
FIG. 4 is a view for explaining a problem of a general semiconductor light emitting device of an edge emitting type.
Figure 5A:
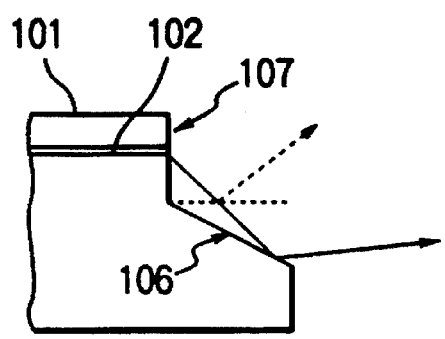
FIGS. 5a to 5e are views for explaining operations and actions of semiconductor light emitting devices in the present invention.

A semiconductor light emitting device having a first construction of the present invention is a semiconductor light emitting device of an edge emitting type having an active layer surface parallel to a reference plane and having a light emitting surface formed by etching until below the active layer surface in a direction perpendicular to the reference plane. Therefore, when there is no influence of the substrate in front of the light emitting surface, a peak position of a far-field emission pattern is directed to a direction perpendicular to the light emitting surface. Further, in this light emitting device, as shown in FIG. 5a, an upper surface 106 of a substrate in front of a light emitting surface 107 is inclined in a direction separated from a surface of an active layer 102 as this upper surface 106 advances forward from the light emitting surface 107. An angle formed between the reference plane and the upper surface 106 of the substrate in front of the light emitting surface 107 is greater than a half beam angle at half-power points of the far-field emission pattern. Therefore, no light component within the full beam angle at half-power points of the far-field emission pattern as a large part of light emitted from the light emitting surface is reflected on the upper surface 106 of the substrate in front of the light emitting surface so that this light component is not an object to be interfered. In the general structure shown in FIG. 3, a terrace surface in the vicinity of the light emitting surface is horizontal. In contrast to this, in the semiconductor light emitting device of the present invention, the upper surface of the substrate is shifted on a wide angle side as this upper surface is separated from a facet. Thus, when a wide angle light component of the light radiant angle distribution is reflected on the substrate surface 106, this light component is reflected on a reference surface at a lower angle so that the inclination of a light emitting direction can be reduced. Further, when a length of the substrate in front of the light emitting surface 107 is set to be shorter, light interference is naturally reduced.

Figure 5B:
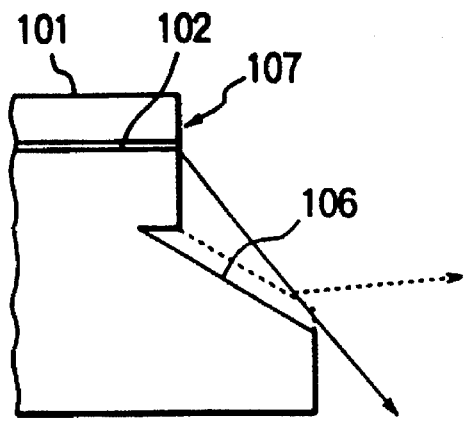

In a second construction of the semiconductor light emitting device, the substrate below the light emitting surface 107 is undercut-etched as shown in FIG. 5b in addition to the first construction. Therefore, a distance from an active layer position of the light emitting surface 107 to the front substrate surface 106 is increased in comparison with the light emitting device of the first construction even when an angle formed between the reference surface and the upper surface 106 of the substrate in front of the light emitting surface 107 is equal. Hence, light emitted from the light emitting surface 107 is reflected further in front of the substrate. Accordingly, if a substrate length in front of the light emitting surface is equal, a light component reflected on the substrate surface 106 is further reduced.

The action of a semiconductor light emitting device having a third construction of the present invention will next be explained. An interference condition of light on a light emitting surface is represented by the following formula.

$$2nd \sin\theta/\lambda + \tfrac{1}{2} = m \quad (m=1, 2, 3 \ldots)$$

When m=1 is set, an angle $\phi$ satisfying the interference condition is provided as follows from this formula.

$$\phi = arc \sin (\lambda/4nd)$$

Figure 5C:
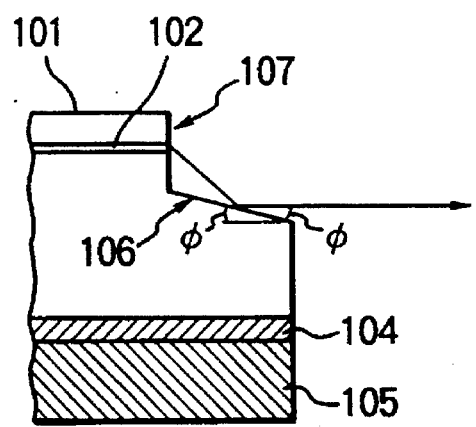

Namely, first order interference peak light having a highest light output is emitted at an elevation angle $\phi$ with respect to the upper surface of the substrate in front of the light emitting surface. In the third construction of the semiconductor light emitting device, when a back surface of the substrate in the semiconductor light emitting device 101 is die-bonded to a stem 105 with a conductive adhesive 104 as shown in FIG. 5c, the upper surface 106 of the substrate in front of the light emitting surface 107 is located at the same angle of depression as $\phi$ with respect to a die bonding surface. Accordingly, the first order interference light as peak light of the far-field emission pattern in a vertical direction is emitted in parallel with the die bonding surface.

A semiconductor light emitting device having a fourth construction of the present invention is a semiconductor light emitting device of an edge emitting type formed in a mesa shape and having a light emitting surface and an etched side surface formed by etching until below an active layer surface. An angle $\phi$ formed between an upper surface of the substrate in front of the light emitting surface and a mesa-etched bottom surface of the substrate is set to the following formula.

$$\phi = arc \sin (\lambda/4nd)$$

Figure 5E:
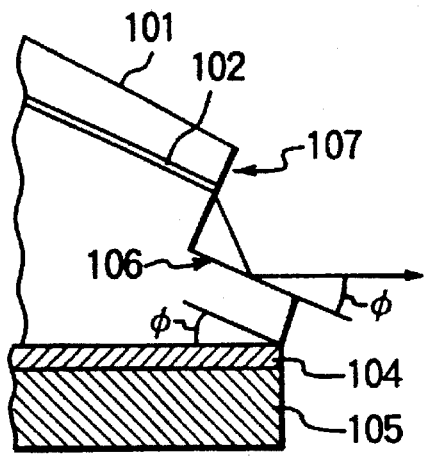
Figure 5D:
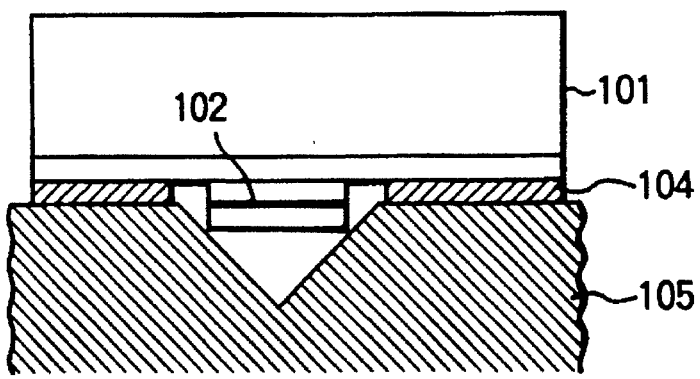

When such a semiconductor light emitting device 101 of a mesa type is mounted to a stem 105 in a junction-down system as shown in FIG. 5d, the mesa-etched bottom surface of the substrate becomes a die bonding surface. Accordingly, similar to the third construction of the semiconductor light emitting device, peak light of a far-field emission pattern in a vertical direction is emitted in parallel with the die bonding surface.

A semiconductor light emitting device having a fifth construction of the present invention is suitable for a junction-up mounting system. In the junction-up mounting, a back surface of the substrate is adhered to the stem 105. Therefore, in this semiconductor light emitting device, a substrate thickness is increased as the substrate is separated from a light emitting surface 107 as shown in FIG. 5e. When the back surface of the substrate is arranged on a horizontal stem surface, an angle $\phi$ formed between this horizontal stem surface and an upper surface 106 of the substrate in front of the light emitting surface 107 is set to the following formula.

$$\phi = arc \sin (\lambda/4nd)$$

Thus, as shown in FIG. 5e, the inclination of a light emitting direction caused by light interference is compensated by an inclination of the substrate and first order interference light is emitted in parallel with a bonding surface.

It is sufficient to form a shape of the back surface of the substrate such that this back surface is inclined by a predetermined angle $\phi$ when the back surface is arranged on the horizontal surface. Accordingly, the back surface of the substrate is not necessarily set to a slanting plane. For example, the shape of the back surface of the substrate may be set to a stepwise shape in which the substrate thickness is increased as the substrate is separated from the light emitting surface.

[Embodiment 1]

Figure 6:
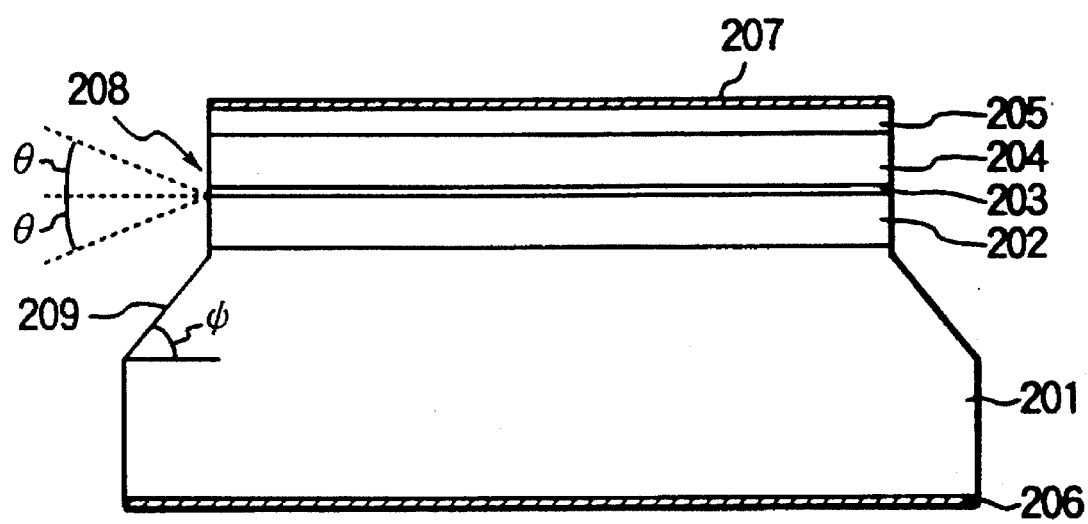
FIG. 6 is a cross-sectional view of a semiconductor light emitting device in accordance with a first embodiment of the present invention.

FIG. 6 is a cross-sectional view showing an embodiment of a semiconductor light emitting device having a first construction of the present invention. In FIG. 6, reference numerals 201, 202 and 203 respectively designate an n-type GaAs substrate, an n-type AlGaAs clad layer and an undope-GaAs active layer. Reference numerals 204, 205 206 and 207 respectively designate a p-type AlGaAs clad layer, a p-type GaAs contact layer, an n-side electrode and a p-side electrode. A light emitting surface 208 is formed by dry etching. A substrate surface 209 is projected in front of the light emitting surface and is called a terrace in the following description.

FIGS. 7a to 7d are views showing manufacturing processes of the semiconductor light emitting device shown in FIG. 6. A main portion of the present invention resides in the shape of a light emitting element near a facet thereof. Accordingly, no electric current narrowing structure is illustrated. An electric current narrowing method can be selectively constructed by a suitable means such as an oxide stripe structure, a buried heterostructure, etc. in accordance with an object and performance of the light emitting device.

Figure 7A:
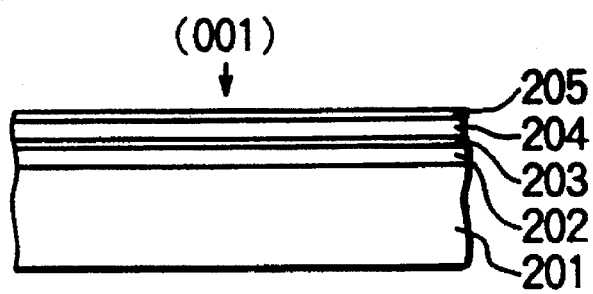
FIGS. 7a to 7d are views for explaining manufacturing processes of the semiconductor light emitting device in the first embodiment of the present invention.

As shown in FIG. 7a, firstly, an n-type AlGaAs clad layer 202, an undope-GaAs active layer 203, a p-type AlGaAs clad layer 204 and a p-type GaAs contact layer 205 are epitaxially grown on an n-type (001) GaAs substrate 201. An metal organic chemical vapor deposition (MOCVD) is used as a means of crystal growth.

Figure 7B:
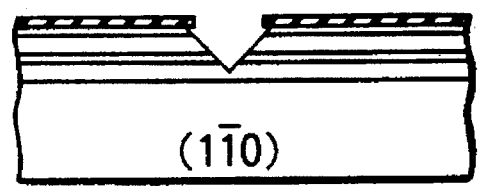

Subsequently, chemical etching is performed with a silicon nitride layer patterned by photolithography as a mask. An anisotropic etching liquid of bromomethanol is used as an etching liquid. An etching speed of this etching liquid on (111)-face is slow with respect to (100)-face. Therefore, the (111)-face appears on a surface as the etching operation is performed. Therefore, if a groove is formed in parallel with <11$^-$0>-direction, a chemical etching shape is formed in the shape of a V-shaped groove as shown in FIG. 7b. The above notation 1$^-$ is used instead of a number with a bar.

Figure 7C:
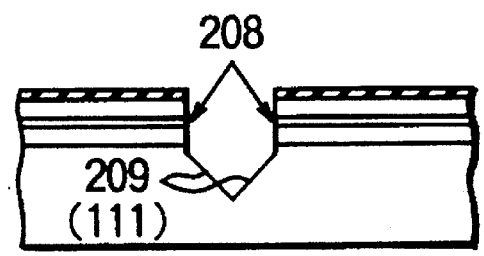

Next, dry etching is performed until below the n-type clad layer 202 by an electron cyclotron resonance-reactive ion beam etching (ECR-RIBE) with a photoresist as a mask. Thus, a light emitting surface 208 is formed. In this etching method, a smooth etching shape approximately perpendicular to the active layer is obtained irrespective of the crystal facet as shown in FIG. 7c.

Figure 7D:
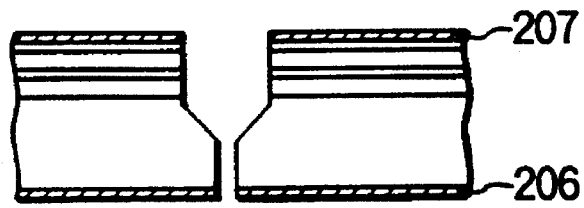

Thereafter, a p-side electrode 207 and an n-side electrode 206 are formed. Finally, light emitting elements are separated from each other by dicing as shown in FIG. 7d.

In the semiconductor light emitting device manufactured by the above manufacturing processes, an angle Ψ formed between the terrace 209 manufactured by the chemical etching and a principal plane of the substrate is determined by a crystal structure and is set to about 55°. A half beam angle at half-power points θ of a far-field emission pattern in a vertical direction of the semiconductor laser is typically equal to 10° to 30° so that this angle is smaller than an inclination angle of the terrace 209. Accordingly, no light component within the full beam angle at half-power points of the far-field emission pattern is reflected on the terrace 209 so that this light component does not contribute to light interference. Since the inclination angle of the terrace 209 is a large value such as 55°, a ratio of light reflected on the terrace 209 is also very reduced in comparison with the general structure with respect to a light component having an angle greater than a full beam angle at half-power points of the far-field emission pattern.

Figure 8:
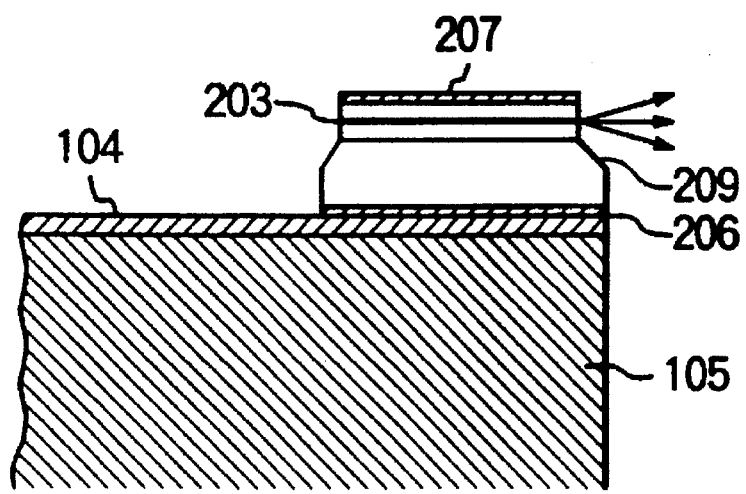
FIG. 8 is a view showing an arranging state of the semiconductor light emitting device at its mounting time in the first embodiment of the present invention.

FIG. 8 is a cross-sectional view showing a state in which the semiconductor light emitting device in the embodiment 1 is mounted onto a stem 105 in a junction-up system. No light emitted from the light emitting surface 208 is almost influenced by reflection and interference on the terrace 209 and this light can be inputted to an optical fiber so that no optical coupling efficiency is reduced.

[Embodiment 2]

Figure 9:
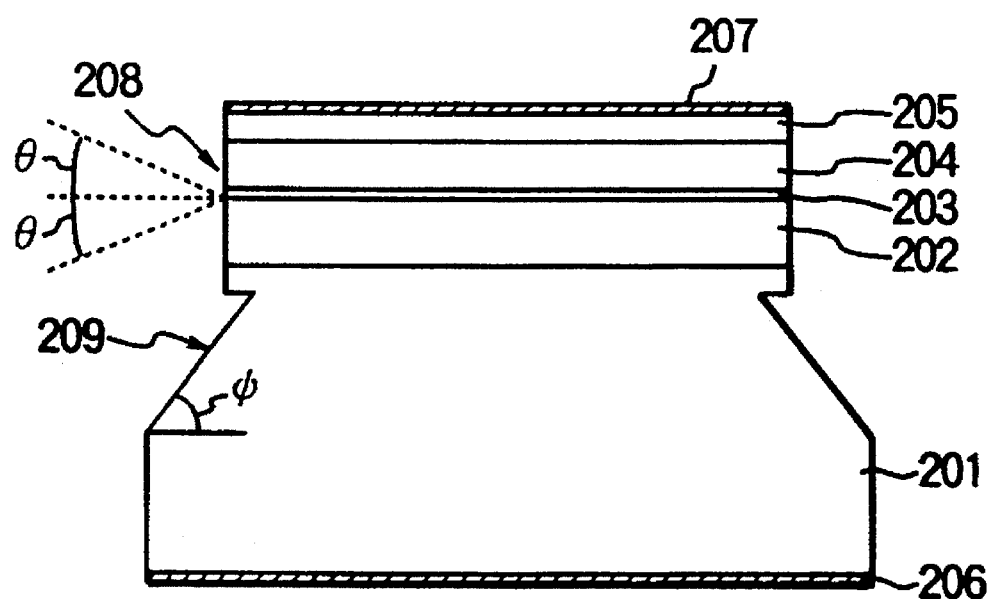
FIG. 9 is a cross-sectional view of a semiconductor light emitting device in accordance with a second embodiment of the present invention.

FIG. 9 is a cross-sectional view showing an embodiment of a semiconductor light emitting device having a second construction of the present invention. This light emitting device differs from the light emitting device shown in FIG. 6 in that a substrate 201 in the vicinity of a light emitting surface 208 is undercut-etched on an inner side from the light emitting surface 208 and a terrace 209 is started from the inner side.

Manufacturing processes of the semiconductor light emitting device shown in FIG. 9 are different from those of the semiconductor light emitting device shown in FIG. 6. These manufacturing processes will next be explained with reference to FIGS. 10a to 10d.

Figure 10A:
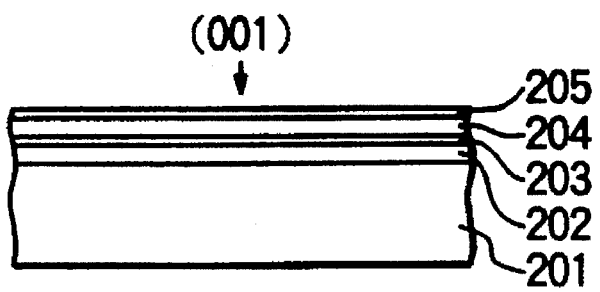
FIGS. 10a to 10d are views for explaining manufacturing processes of the semiconductor light emitting device in the second embodiment of the present invention.

As shown in FIG. 10a, firstly, an n-type AlGaAs clad layer 202, an undope-GaAs active layer 203, a p-type AlGaAs clad layer 204 and a p-type GaAs contact layer 205 are sequentially grown epitaxially on an n-type (001) GaAs substrate 201 using a MOCVD method.

Figure 10B:
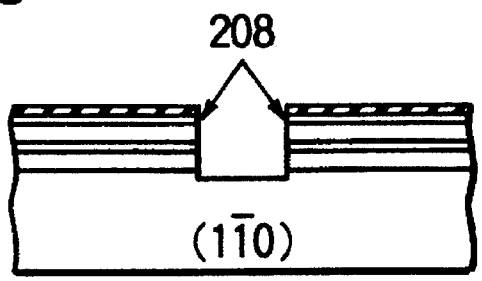

Subsequently, dry etching is performed until below the n-type clad layer 202 by an ECR-RIBE with a photoresist patterned by photolithography as a mask. Thus, a vertical light emitting surface 208 is formed as shown in FIG. 10b. At this time, a stripe groove is formed in <11$^-$0> direction in advance.

Figure 10C:
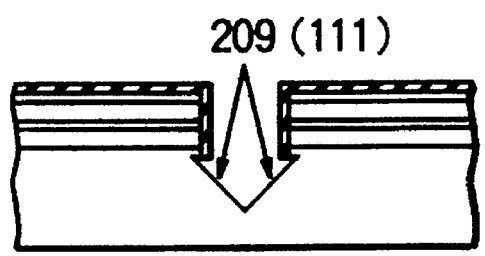

Next, the light emitting surface 208 is covered with a silicon nitride layer. Thereafter, chemical etching using an anisotropic etching liquid of bromomethanol is performed with respect to this silicon nitride layer. Since the stripe groove is formed in the <11$^-$0> direction, a chemical etching shape is set as a slanting terrace 209 as shown in FIG. 10c. In this method, a light emitting element is under-etched until behind the light emitting surface from nature of the chemical etching.

Figure 10D:
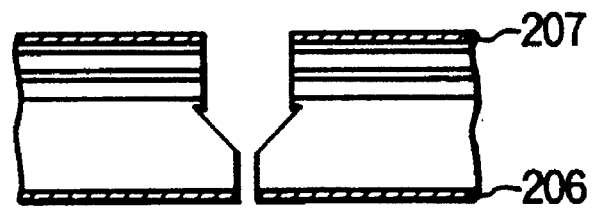

Thereafter, the silicon nitride layer is removed from the light emitting element and a p-side electrode 207 and an n-side electrode 206 are formed. Finally, light emitting elements are separated from each other by dicing as shown in FIG. 10d.

In the semiconductor light emitting device manufactured by the above manufacturing processes, an angle Ψ formed between the terrace 209 manufactured by the chemical etching and a principal plane of the substrate is set to about 55° generally greater than a half beam angle at half-power points θ of a far-field emission pattern in a vertical direction of the semiconductor laser. Accordingly, no light component within the full beam angle at half-power points of the far-field emission pattern is reflected on the terrace 209 so that this light component does not contribute to light interference. Further, since the terrace 209 is formed until behind the light emitting surface 208, a distance from a light emitting surface position of the active layer 203 to a terrace surface is increased. Accordingly, a reflecting ratio of a light component having an angle greater than a full beam angle at half-power points of the far-field emission pattern and reflected on the terrace 209 is further reduced in comparison with the light emitting device shown in FIG. 6.

FIG. 19 shows one example of a light radiant angle distribution in a vertical direction of the semiconductor light emitting device. [a] of FIG. 19 shows a light radiant angle distribution of the semiconductor light emitting device having a horizontal terrace obtained by forming a facet by dry etching. [b] of FIG. 19 shows a light radiant angle distribution of the semiconductor light emitting device shown in the embodiment 2. When the semiconductor light emitting device has the horizontal terrace, a peak position of the light radiant angle distribution is inclined about 10 degrees on a positive side. In contrast to this, when the terrace is manufactured by the chemical etching, there are almost no influences of light reflection on a terrace surface so that no light interference is caused and light is radiated in parallel with a reference plane.

Figure 11:
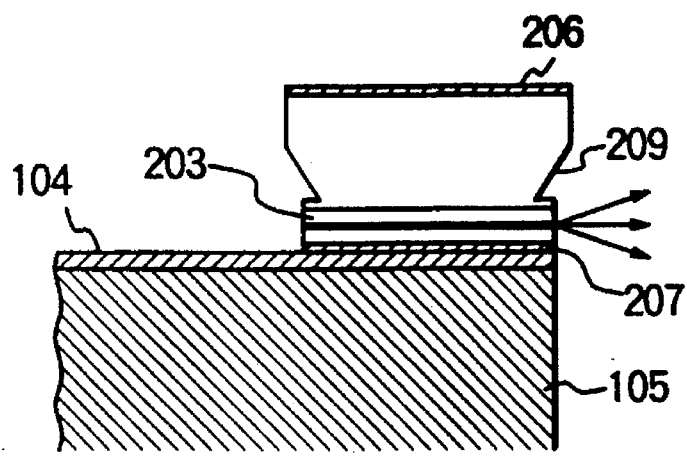
FIG. 11 is a view showing an arranging state of the semiconductor light emitting device at its mounting time in the second embodiment of the present invention.

FIG. 11 is a cross-sectional view showing a state in which the semiconductor light emitting device in the embodiment 2 is mounted onto a stem 105 in a junction-down system. Similar to the embodiment 1, light emitted from the light emitting surface 208 has no influences of reflection and interference on the terrace 209 and is inputted to an optical fiber in the junction-down system.

[Embodiment 3]

Figure 12:
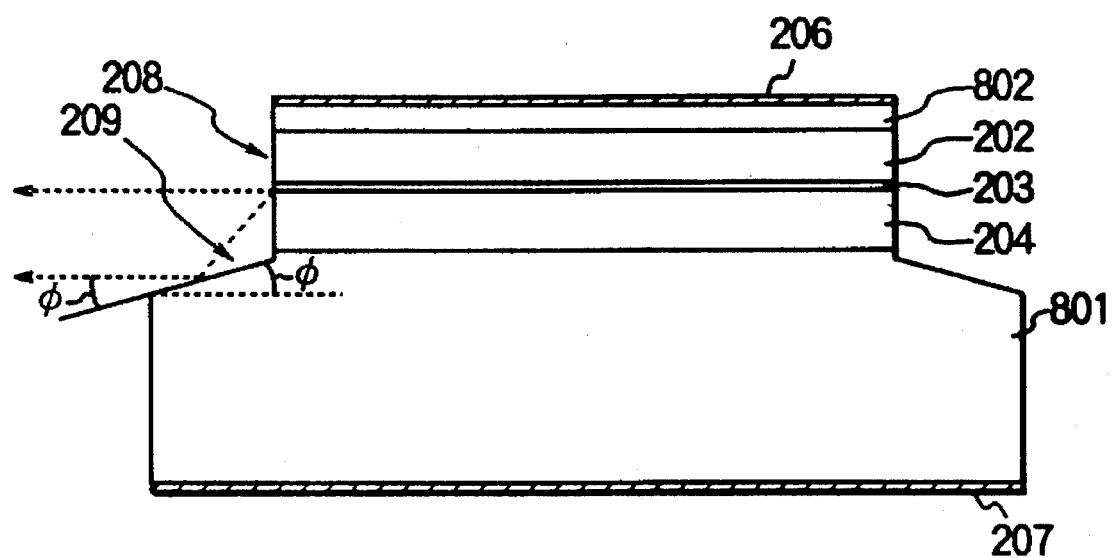
FIG. 12 is a cross-sectional view of a semiconductor light emitting device in accordance with a third embodiment of the present invention.

FIG. 12 is a cross-sectional view showing an embodiment of a semiconductor light emitting device having a third construction of the present invention. In FIG. 12, reference numerals 801, 204 and 203 respectively designate a p-type GaAs substrate, a p-type AlGaAs clad layer and an undope-GaAs active layer. Reference numerals 202 and 802 respectively designate an n-type AlGaAs clad layer and an n-type GaAs contact layer. Reference numerals 206 and 207 respectively designate an n-side electrode and a p-side electrode for injecting an electric current into a light emitting element. Different from the first and second embodiments, the p-type substrate is used in this third embodiment. Accordingly, a laminating order of the p-type layers and the n-type layers in the third embodiment is reverse to that in the first and second embodiments. A light emitting surface 208 is formed by drying etching and a terrace 209 is projected in front of the light emitting surface. The terrace 209 is inclined by a predetermined angle $\phi$ with respect to a principal plane of the substrate.

A manufacturing method of the semiconductor light emitting device shown in FIG. 12 will next be explained with reference to FIGS. 13a to 13d.

Figure 13A:
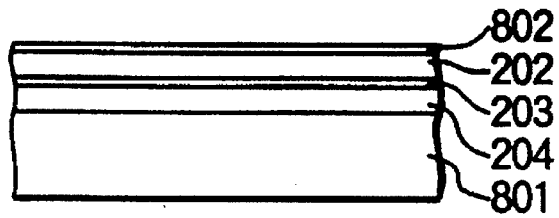
FIGS. 13a to 13d are views for explaining manufacturing processes of the semiconductor light emitting device in the third embodiment of the present invention.

As shown in FIG. 13a, firstly, a p-type AlGaAs clad layer 204, an undope-GaAs active layer 203, an n-type AlGaAs clad layer 202 and an n-type GaAs contact layer 802 are sequentially grown epitaxially on a p-type GaAs substrate 801 by a MOCVD method.

Figure 13B:
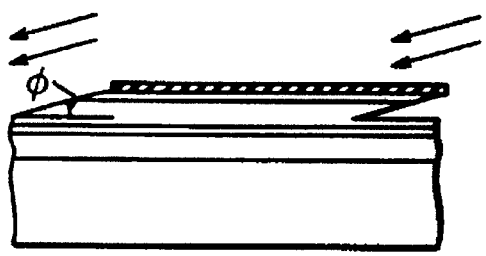

Next, dry etching is slantingly performed by an ECR-RIBE device using a Cr mask as shown in FIG. 13b. At this time, an angle $\phi$ formed between a principal plane of the substrate and a slantingly etched surface is set to the following predetermined value $$\phi = \arcsin(\lambda/4nd)$$

by adjusting an angle formed between an ion beam and the substrate. Here, $\lambda$ is a light emitting wavelength of the semiconductor light emitting device and n is a refractive index of a medium outside the semiconductor light emitting device. Further, d is a distance of a perpendicular line drawn from an active layer position of the light emitting surface to a terrace.

Figure 13C:
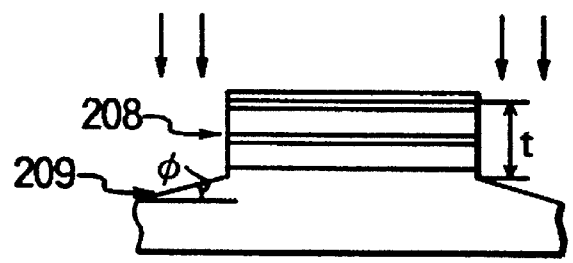

Subsequently, dry etching is vertically performed by the ECR-RIBE device until below the p-type AlGaAs clad layer 204 so that a light emitting surface 208 is formed as shown in FIG. 13c. At this time, it is necessary to control an operation of the semiconductor light emitting device such that an etching depth t satisfies the following relation.

$$\phi = d/\cos\phi$$

Since an etching rate is uniform within a substrate surface, the slanting surface formed in FIG. 13b is shifted by the depth t on a lower side of the substrate while a slanting angle of this slanting surface is held.

Figure 13D:
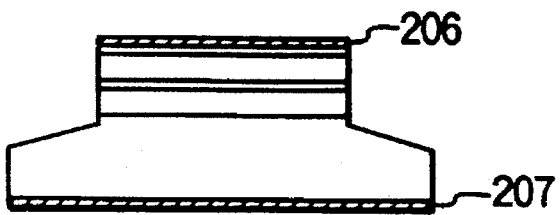

Thereafter, an n-side electrode 206 and a p-side electrode 207 are formed and a light emitting element is cut by dicing as shown in FIG. 13d.

When the etching depth t is set to $t=d/\cos\phi$, a first order interference condition of light emitted from the light emitting surface 208 and light reflected on the terrace 209 is provided as follows.

$$2nd \sin\theta/\lambda = \frac{1}{2}$$

Accordingly, interference light of the first order is outputted in the following angular direction with respect to the terrace 209 as a reflecting surface.

$$\phi = \arcsin(\lambda/4nd)$$

For example, $\phi=6.2°$ is set when d=2 μm is set and light having a light emitting wavelength 870 nm of GaAs is emitted to the air (n=1). When light is emitted to optical resin (n=1.46), $\phi=4.3°$ is set. In this semiconductor light emitting device, the inclination angle of the terrace 209 is set to the same angle as $\phi$ with respect to a principal plane of the substrate. Therefore, the first order interference light having a maximum intensity of a far-field emission pattern in a vertical direction is emitted in parallel with the principal plane of the substrate. Accordingly, when this semiconductor light emitting device is mounted onto the stem 105 in the junction-down or junction-up system, peak light of the far-field emission pattern can be emitted in parallel with a die bonding surface. Therefore, no optical coupling efficiency is reduced and light can be effectively inputted to an optical fiber.

FIG. 20 is a graph showing light intensity inputted to the optical fiber when the inclination angle of the terrace 209 is changed. The light intensity is normalized with inclination angle 0 as value 1. As shown in FIG. 20, when the inclination angle of the terrace 209 is set to the same angle as $\phi$ ($\phi=8$ degrees in this case), a light output inputted to the optical fiber is largest. This light output is increased by about 35% in comparison with the inclination angle 0.

[Embodiment 4]

Figure 14:
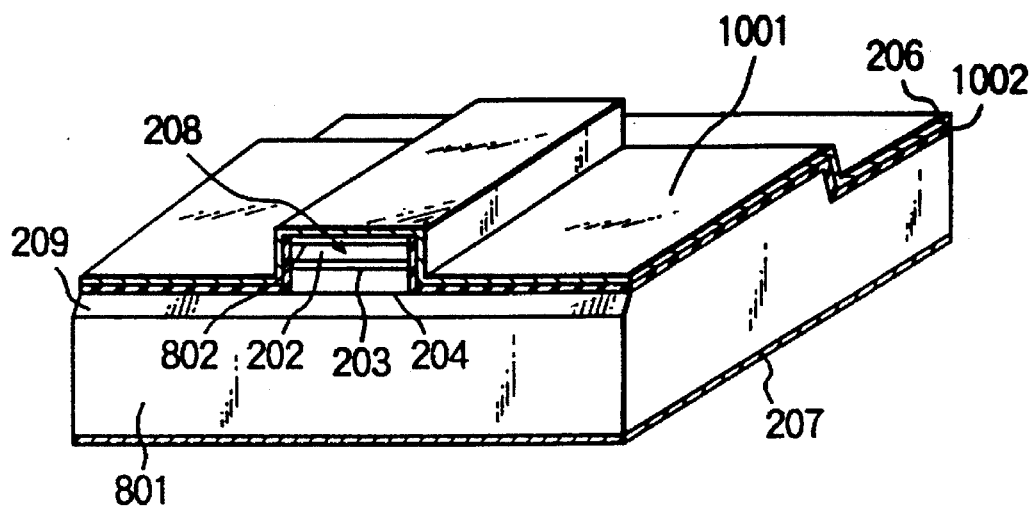
FIG. 14 is a perspective view of a semiconductor light emitting device in accordance with a fourth embodiment of the present invention.

FIG. 14 is a perspective view showing an embodiment of a semiconductor light emitting device having a fourth construction of the present invention. In FIG. 14, reference numerals 801, 204 and 203 respectively designate a p-type GaAs substrate, a p-type AlGaAs clad layer and an undope-GaAs active layer. Reference numerals 202 and 802 respectively designate an n-type AlGaAs clad layer and an n-type GaAs contact layer. As shown in FIG. 14, this semiconductor light emitting device is a mesa type light emitting device in which a light emitting portion is formed in a mesa shape by dry etching. A light emitting surface 208 is formed by dry etching. A bottom surface 1001 of the substrate is dry-etched. A silicon oxide layer 1002 is used to narrowly flow an electric current through only a mesa portion. Reference numerals 206 and 207 respectively designate an n-side electrode and a p-side electrode for injecting an electric current into a light emitting element. A terrace 209 is projected in front of the light emitting surface and is inclined by the following predetermined angle $\phi$ with respect to the mesa-etched bottom surface.

$$\phi = \arcsin(\lambda/4nd)$$

When an etching depth t is set to $t=d/\cos\phi$, first order interference light of light emitted from the light emitting surface 208 and light reflected on the terrace 209 is outputted to the terrace 209 as a reflecting surface in a direction of $\phi=\arcsin(\lambda/4nd)$. In this semiconductor light emitting device, an inclination angle of the terrace 209 is set to the same angle as $\phi$ with respect to the mesa-etched bottom surface 1001 of the substrate. Thus, the first order interference light having a maximum intensity of a far-field emission pattern in a vertical direction is emitted in parallel with the mesa-etched bottom surface 1001 of the substrate.

Each of FIGS. 15a and 15b is a view showing a state in which the semiconductor light emitting device shown in FIG. 14 is mounted onto a V-groove substrate of silicon (Si). FIG. 15a is a side sectional view of this semiconductor light emitting device and FIG. 15b is a front sectional view of this semiconductor light emitting device. In FIGS. 15a and 15b, reference numerals 203, 103 and 104 respectively designate a GaAs active layer, an optical fiber and a conductive adhesive. Reference numerals 1102 and 1101 respectively designate a silicon substrate and an upper surface of the silicon substrate. In the semiconductor light emitting device in this embodiment, a mesa-etched bottom surface 1001 is adhered to the upper surface 1101 of the silicon substrate through the conductive adhesive 104 in a junction-down system. A light emitting portion of a mesa type is fixedly located within a V-groove of the silicon substrate 1102. When an optical fiber 103 is also mounted into the V-groove of the silicon substrate 1102, it is easy to align the optical fiber 103 and the light emitting device with each other. Peak light of a far-field emission pattern in a vertical direction emitted from the light emitting device is parallel to the optical fiber so that a reduction in optical coupling efficiency is restrained.

[Embodiment 5]

FIG. 16 is a side sectional view showing an embodiment of a semiconductor light emitting device having a fifth construction of the present invention. In FIG. 16, reference numerals 1201, 205 and 204 respectively designate a semi-insulating GaAs substrate, a p-type GaAs contact layer and a p-type AlGaAs clad layer. Reference numerals 203, 202 and 802 respectively designate an undope-GaAs active layer, an n-type AlGaAs clad layer and an n-type GaAs contact layer. Reference numerals 206 and 207 respectively designate an n-side electrode and a p-side electrode. Different from the third and fourth embodiments, the semi-insulating substrate is used and both the n-side electrode 206 and the p-side electrode 207 are formed on a surface of the substrate 1201 in this embodiment. A silicon oxide layer 1002 fulfills a function for narrowing an electric current supplied to a light emitting portion and simultaneously fulfills a function for insulating the n-side electrode and the p-side electrode from each other. A light emitting surface 208 is formed by dry etching. A terrace 209 is projected in front of the light emitting surface. A terrace surface is formed in parallel with a principal plane of the substrate. This semiconductor light emitting device is characterized in that a back surface of the substrate on its light emitting surface side is etched and a stepwise shape 1202 for thinning a thickness of the substrate 1201 is formed.

FIGS. 17a to 17d are views showing manufacturing processes of the semiconductor light emitting device shown in FIG. 16. These manufacturing processes will next be explained with reference to FIGS. 17a to 17d.

Figure 17A:

As shown in FIG. 17a, firstly, a p-type GaAs contact layer 205, a p-type AlGaAs clad layer 204, an undope-GaAs active layer 203, an n-type AlGaAs clad layer 202 and an n-type GaAs contact layer 802 are sequentially grown epitaxially on a semi-insulating GaAs substrate 1201 by a MOCVD method.

Figure 17B:
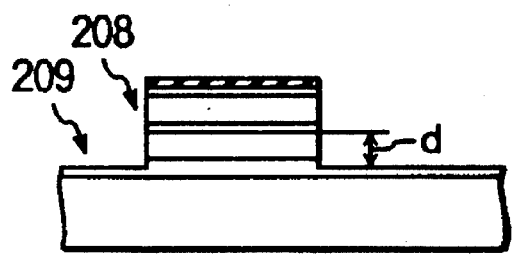

Next, dry etching is vertically performed by an ECRRIBE device with a photoresist as a mask so that a light emitting surface 208 is formed as shown in FIG. 17b. At this time, an etching depth d is controlled such that a mesa-etched bottom surface becomes the p-type contact layer 205.

Figure 17C:
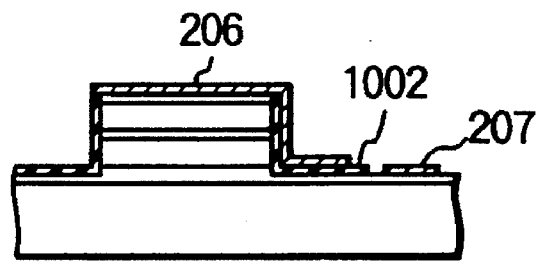

Subsequently, an n-side electrode 206 and a p-side electrode 207 are formed by patterning a silicon oxide layer 1002 as shown in FIG. 17c. The p-side electrode 207 is formed on a surface of the p-type contact layer 205 exposed by dry etching.

Figure 17D:
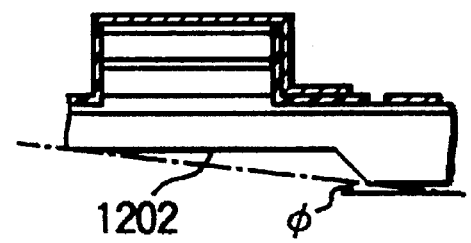

Thereafter, a back surface of the substrate on its light emitting surface side is chemically etched so that a stepwise shape 1202 is formed as shown in FIG. 17d. When h is set to an etching depth of the light emitting device and L is set to an etching width as shown in FIG. 16, the stepwise shape is formed such that the following relation is satisfied.

$$h/L = \tan \phi$$

$$\phi = \arcsin (\lambda/4nd)$$

Finally, a light emitting element is cut by dicing.

When the dry etching depth is d, first order interference light of light emitted from the light emitting surface 208 and light reflected on the terrace 209 is outputted in the direction of an elevation angle $\phi = \arcsin (\lambda/4nd)$. This semiconductor light emitting device is designed and manufactured such that the back surface of the substrate is formed in the stepwise shape 1202 and the etching depth h and the etching width L satisfy the relation of $h/L = \tan \phi$. Therefore, when the substrate back surface is arranged on a horizontal surface, the substrate is inclined by the elevation angle $\phi$ with respect to the horizontal surface. Thus, the first order interference light having a maximum intensity of a far-field emission pattern is emitted in parallel with this horizontal surface.

FIG. 18 is a view showing a state in which the semiconductor light emitting device shown in FIG. 16 is mounted onto a stem 105. In FIG. 18, reference numerals 103, 105 and 1401 respectively designate an optical fiber, a stem and an adhesive. Here, the light emitting device of FIG. 16 is mounted onto the stem 105 in a junction-up system. Since all electrodes are taken out of a surface of the semiconductor light emitting device, it is not necessary to set the adhesive 1401 to be conductive. As shown in FIG. 18, first order interference light emitted from the semiconductor light emitting device is outputted in parallel with an upper surface of the stem and can be vertically incident to a facet of the optical fiber 103. Accordingly, a reduction in optical coupling efficiency can be restrained.

Since the present invention is constructed as explained above, the following effects can be obtained.

In each of the first and second constructions of the semiconductor light emitting device, an angle formed between the upper surface of a substrate in front of a light emitting surface and a reference plane is greater than a half beam angle at half-power points of a far-field emission pattern. Therefore, no light component within the full beam angle at half-power points of the far-field emission pattern as a large part of light emitted from the light emitting surface is reflected on the upper surface of the substrate in front of the light emitting surface so that this light component does not contribute to light interference. Further, when a wide angle light component of the light radiant angle distribution is reflected on the substrate surface, this light component is reflected on a reference face at a lower angle so that the influences of an inclination of a light emitting direction can be further reduced. Thus, an inclination of emitted light with respect to an optical fiber can be reduced so that a reduction in optical coupling efficiency can be restrained.

In particular, in the second construction of the semiconductor light emitting device, a distance from an active layer position of the light emitting surface to a forward substrate surface is increased. Therefore, a light component reflected on the substrate surface is further reduced and the influences of light interference can be further reduced.

In each of the third to fifth constructions of the semiconductor light emitting device, an angle $\phi$ formed between the upper surface of the substrate in front of the light emitting surface and a die bonding surface of the semiconductor light emitting device is set to the following formula.

$$\phi = \arcsin (\lambda/4nd)$$

Accordingly, the inclination of a light emitting direction caused by light interference is compensated and first order interference light having a highest light output is emitted in parallel with the die bonding surface. Thus, the inclination of the light emitting direction with respect to an optical fiber is removed so that a reduction in optical coupling efficiency can be restrained.

The semiconductor light emitting device having the fourth construction of the present invention is a semiconductor light emitting device of an edge emitting type having a mesa shape. An angle formed between the upper surface of a substrate in front of the light emitting surface and a mesa-etched bottom surface of the substrate is set to the following formula.

$$\phi = \arcsin(\lambda/4nd)$$

Therefore, the fourth construction is suitable for junction-down mounting for die-bonding on the mesa-etched bottom surface of the substrate.

In the fifth construction of the semiconductor light emitting device, a substrate thickness is increased as the substrate is separated from the light emitting surface. When a back surface of the substrate is arranged on a horizontal surface, an angle $\phi$ formed between the horizontal surface and the upper surface of the substrate in front of the light emitting surface is set to the following formula.

$$\phi = \arcsin(\lambda/4nd)$$

Therefore, the fifth construction is suitable for junction-up mounting.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor light emitting device of an edge emitting type having an active layer surface parallel to a reference plane and having a light emitting surface formed by etching until below the active layer surface in a direction perpendicular to the reference plane;

the semiconductor light emitting device being constructed such that an upper surface of a substrate in front of the light emitting surface is inclined in a direction separated from the active layer surface as this upper surface advances forward from the light emitting surface; and an angle formed between the reference plane and the upper surface of the substrate in front of the light emitting surface is greater than a half beam angle at half-power points of a far-field emission pattern in a vertical direction.

2. A semiconductor light emitting device of an edge emitting type having an active layer surface parallel to a reference plane and having a light emitting surface formed by etching until below the active layer surface in a direction perpendicular to the reference plane;

the semiconductor light emitting device being constructed such that an upper surface of a substrate in front of the light emitting surface is inclined in a direction separated from the active layer surface as this upper surface advances forward from the light emitting surface;

an angle formed between the reference plane and the upper surface of the substrate in front of the light emitting surface is greater than a half beam angle at half-power points of a far-field emission pattern in a vertical direction; and the substrate below the light emitting surface is undercut-etched.

3. A semiconductor light emitting device of an edge emitting type having a light emitting surface formed by etching until below an active layer surface;

the semiconductor light emitting device being constructed such that an upper surface of a substrate in front of the light emitting surface is inclined in a direction separated from the active layer surface as this upper surface advances forward from the light emitting surface; and an angle $\phi$ formed between the upper surface of the substrate in front of the light emitting surface and a die bonding surface of the semiconductor light emitting device is provided by the following formula $$\phi = \arcsin(\lambda/4nd)$$

where $\lambda$ is a light emitting wavelength of the semiconductor light emitting device, n is a refractive index of a medium outside the semiconductor light emitting device, and d is a distance of a perpendicular line drawn from an active layer position of the light emitting surface to the upper surface of the substrate in front of the light emitting surface.

4. A semiconductor light emitting device of an edge emitting type which has a light emitting surface and an etched side face formed by etching until below an active layer surface and is formed in a mesa shape;

the semiconductor light emitting device being constructed such that an upper surface of a substrate in front of the light emitting surface is inclined in a direction separated from the active layer surface as this upper surface advances forward from the light emitting surface; and an angle $\phi$ formed between the upper surface of the substrate in front of the light emitting surface and a mesa-etched bottom surface of the substrate is provided by the following formula $$\phi = \arcsin(\lambda/4nd)$$

where $\lambda$ is a light emitting wavelength of the semiconductor light emitting device, n is a refractive index of a medium outside the semiconductor light emitting device, and d is a distance of a perpendicular line drawn from an active layer position of the light emitting surface to the upper surface of the substrate in front of the light emitting surface.

5. A semiconductor light emitting device of an edge emitting type having a light emitting surface formed by etching until below an active layer surface;

the semiconductor light emitting device being constructed such that a substrate thickness is increased as the substrate is separated from the light emitting surface; and when a back surface of the substrate is arranged on a horizontal surface, an angle $\phi$ formed between the upper surface of the substrate in front of the light emitting surface and this horizontal surface is provided by the following formula $$\phi = \arcsin(\lambda/4nd)$$

where $\lambda$ is a light emitting wavelength of the semiconductor light emitting device, n is a refractive index of a medium outside the semiconductor light emitting device, and d is a distance of a perpendicular line drawn from an active layer position of the light emitting surface to the upper surface of the substrate in front of the light emitting surface.

* * * * *